US011751348B2

(12) United States Patent
Takagi

(10) Patent No.: US 11,751,348 B2
(45) Date of Patent: Sep. 5, 2023

(54) CASING FOR ELECTRICAL APPARATUS AND POWER CONTROL APPARATUS

(71) Applicant: KYOCERA Corporation, Kyoto (JP)

(72) Inventor: Takafumi Takagi, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 196 days.

(21) Appl. No.: 17/295,189

(22) PCT Filed: Nov. 5, 2019

(86) PCT No.: PCT/JP2019/043236
§ 371 (c)(1),
(2) Date: May 19, 2021

(87) PCT Pub. No.: WO2020/110624
PCT Pub. Date: Jun. 4, 2020

(65) Prior Publication Data
US 2022/0022335 A1    Jan. 20, 2022

(30) Foreign Application Priority Data

Nov. 28, 2018   (JP) .................................. 2018-222793

(51) Int. Cl.
*H05K 5/03* (2006.01)
*H05K 5/06* (2006.01)
*H05K 7/14* (2006.01)

(52) U.S. Cl.
CPC ................. *H05K 5/03* (2013.01); *H05K 5/06* (2013.01); *H05K 7/1432* (2013.01)

(58) Field of Classification Search
None
See application file for complete search history.

(56) References Cited

U.S. PATENT DOCUMENTS

| 7,595,976 | B2 | 9/2009 | Kato et al. | |
| 9,174,453 | B1 * | 11/2015 | Dodd | B41J 2/14072 |
| 10,953,825 | B2 * | 3/2021 | Sanvito | B60R 16/03 |
| 10,971,909 | B1 * | 4/2021 | Rood | H02G 15/10 |
| 2007/0121288 | A1 | 5/2007 | Kato et al. | |
| 2018/0013230 | A1 * | 1/2018 | Oda | H01R 13/7032 |

(Continued)

FOREIGN PATENT DOCUMENTS

| CN | 1945198 A | | 4/2007 | |
| JP | 2007102555 A | * | 4/2007 | ........... G08B 13/196 |

(Continued)

*Primary Examiner* — Xanthia C Cunningham
(74) *Attorney, Agent, or Firm* — HAUPTMAN HAM, LLP

(57) ABSTRACT

Provided are a casing for an electrical apparatus for housing an electrical apparatus includes: a casing body having an opening; a cover body that includes a flat plate-like cover portion having a rectangular shape for covering the opening, and outer side surface cover portions that are continuous to respective sides of the flat plate-like cover portion and cover outer side surfaces of the casing body; and first ribs that are provided on the outer side surfaces of the casing body covered by the outer side surface cover portions and extend along the respective sides, and a power control apparatus that includes the casing for an electrical apparatus and the electrical apparatus housed in the casing for an electrical apparatus.

8 Claims, 7 Drawing Sheets

(56) References Cited

U.S. PATENT DOCUMENTS

2018/0020561 A1* 1/2018 Ichikizaki ................ H05K 5/03
2018/0103556 A1* 4/2018 Tashiro ............... B60R 16/0238

FOREIGN PATENT DOCUMENTS

| JP | 2007102555 A | 4/2007 |
| JP | 2012164878 A | 8/2012 |
| WO | 2006043325 A1 | 4/2006 |

* cited by examiner

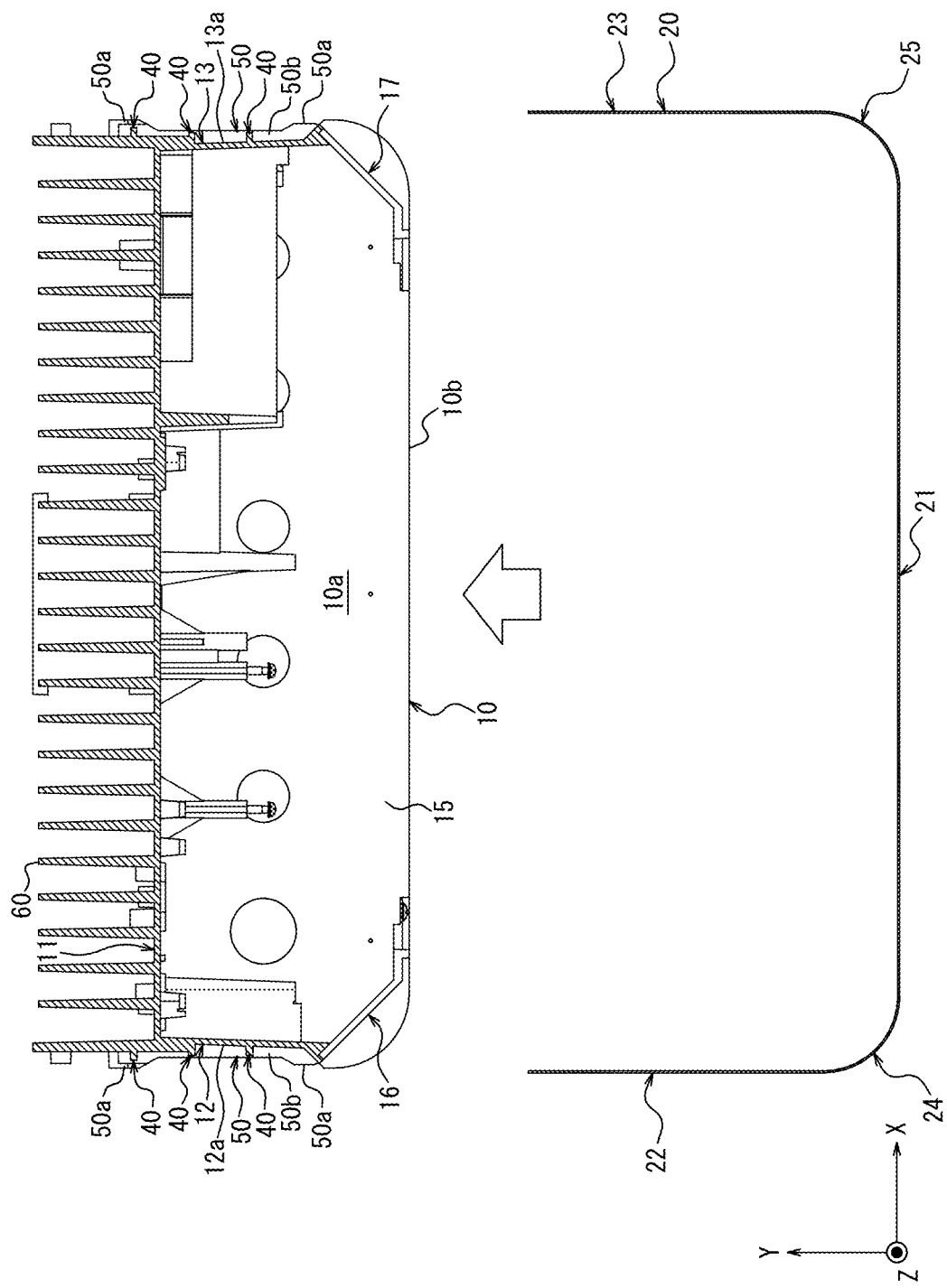

CASING FOR ELECTRICAL APPARATUS AND POWER CONTROL APPARATUS

CROSS REFERENCE TO RELATED APPLICATION

This application is a National Phase of International Application Number PCT/JP2019/043236 filed Nov. 5, 2019, and claims priority to and the benefit of Japanese Patent Application No. 2018-222793 filed on Nov. 28, 2018, the entire contents of which are incorporated herein by reference.

TECHNICAL FIELD

The present disclosure relates to a casing for an electrical apparatus and a power control apparatus.

BACKGROUND

An electric power control apparatus such as a power control apparatus (a power converter) in which an electrical apparatus that is connected to a solar cell and has a function of converting DC power from the solar cell into AC power is housed in a casing is becoming popular mainly for a domestic use. Because such a power control apparatus is often installed outdoors, the casing for housing the electrical apparatus needs to have a high waterproof property.

For example, PTL 1 set forth below discloses a casing that includes a casing body (a metal casing) for housing an electrical apparatus, a cover body (a metal cover) for covering an opening of the casing boy, and a waterproof seal arranged between the casing boy and the cover body, whereby improving the waterproof property.

CITATION LIST

Patent Literature

PTL 1: JP-A-2012-164878

SUMMARY

A casing for an electrical apparatus according to an embodiment of the present disclosure is a casing for an electrical apparatus that houses an electrical apparatus and includes: a casing body having an opening; a cover body that includes a flat plate-like cover portion having a rectangular shape for covering the opening and an outer side surface cover portion that is continuous to a side of the flat plate-like cover portion and covers an outer side surface of the casing body; and a first rib that is provided to the outer side surface of the casing body covered by the outer side surface cover portion and extends along the side.

Further, a power control apparatus according to an embodiment of the present disclosure includes any casing for an electrical apparatus according to the present disclosure and an electrical apparatus housed in the casing for an electrical apparatus.

BRIEF DESCRIPTION OF THE DRAWINGS

In the accompanying drawings:

FIG. 7 is a cross-sectional view illustrating a step of attaching the cover body to the casing body.

DETAILED DESCRIPTION

Conventionally, a casing for a power control apparatus installed outdoor is required to have an improved waterproof property to withstand storms and the like.

An object of the present disclosure is to provide a casing for an electrical apparatus that has a simple configuration and an improved waterproof property, and a power control apparatus.

According to the embodiment of the present disclosure, a casing for an electrical apparatus that has a simple configuration and an improved waterproof property and a power control apparatus can be provided.

Hereinafter, an embodiment of the present disclosure will be illustrated in detail with reference to the drawings.

Figure 1:
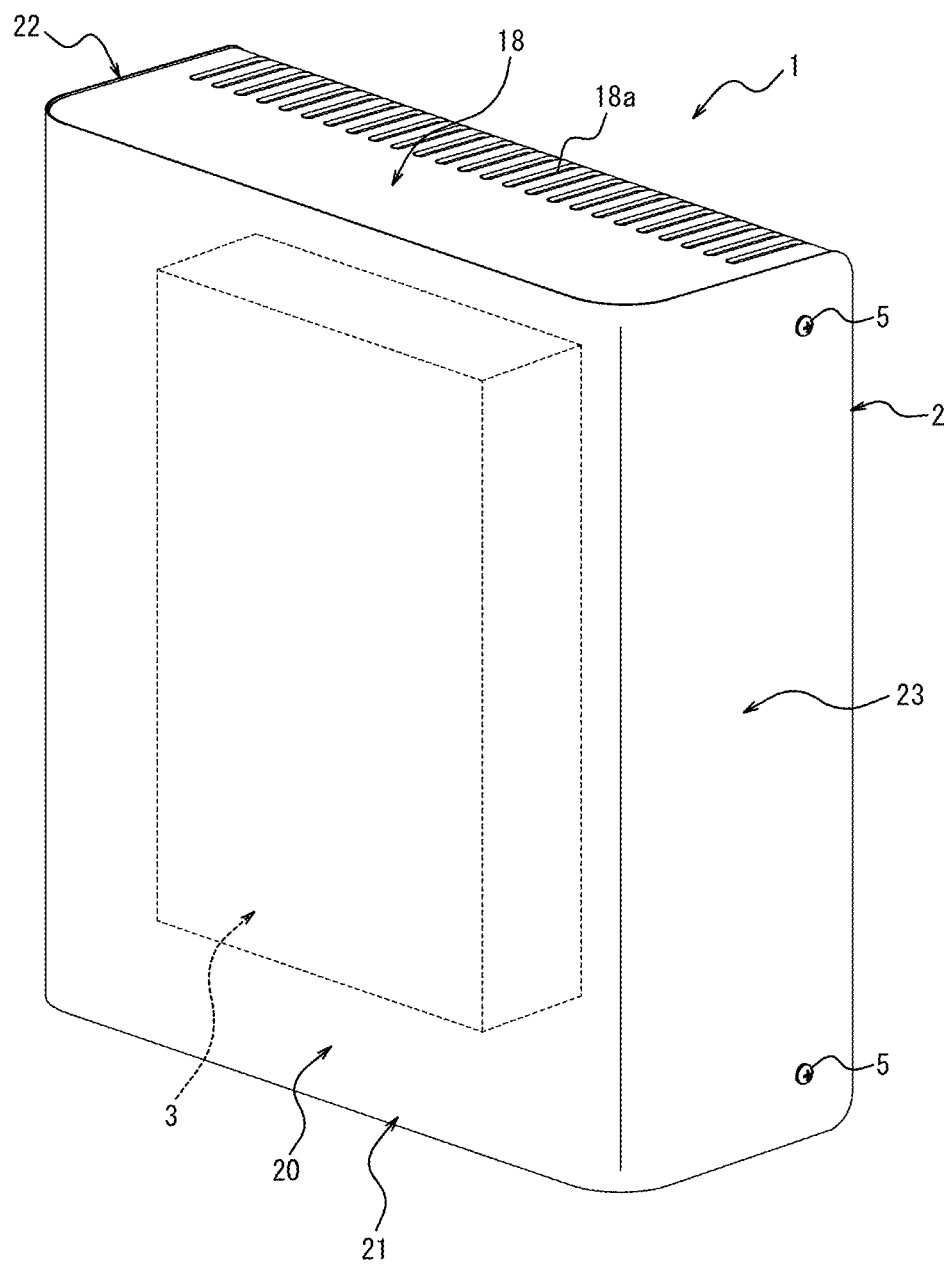
FIG. 1 is a perspective view of a power control apparatus according to an embodiment of the present disclosure.

A power control apparatus 1 according to the present embodiment includes a casing 2 for an electrical apparatus and an electrical apparatus 3 housed in the casing 2 for an electrical apparatus, as illustrated in FIG. 1.

The electrical apparatus 3 schematically illustrated in FIG. 1 is connected to, for example, a solar cell installed on a roof of a house and has a function of converting DC power generated by the solar cell into AC power and outputting the AC power to an electric system of the house. That is, the power control apparatus 1 is configured as a power control apparatus (a power converter) for a domestic use.

The power control apparatus 1 may have a configuration in which the casing 2 for an electrical apparatus houses, for example, a plurality of types of electrical apparatuses having different functions or configurations such as a fuel cell, a storage battery, a ventilation fan, or the like, in addition to the electrical apparatus 3 having the power conversion function as described above. As the storage battery mentioned above, for example, a lithium ion battery or a nickel hydrogen battery can be used. The casing 2 for an electrical apparatus can also house a member such as a heat insulating material or a cushioning material, in addition to the electrical apparatus 3. Further, the electrical apparatus 3 housed in the casing 2 for an electrical apparatus is not limited to one having the power conversion function for the solar cell as described above and may be an electrical apparatus that has other functions such as, for example, a fuel cell, a transformer apparatus, or an apparatus having a function of supplying electric power to a commercial power system.

The power control apparatus 1 may be installed outdoors. In the present embodiment, the power control apparatus 1 may be installed, for example, on the exterior wall of a house by using mounting brackets, a pedestal, or the like.

The power control apparatus 1 is not limited to be installed outdoors but may be installed in other places including indoors.

The casing 2 for housing the electrical apparatus 3 includes a casing body 10 and a cover body 20.

Figure 2:
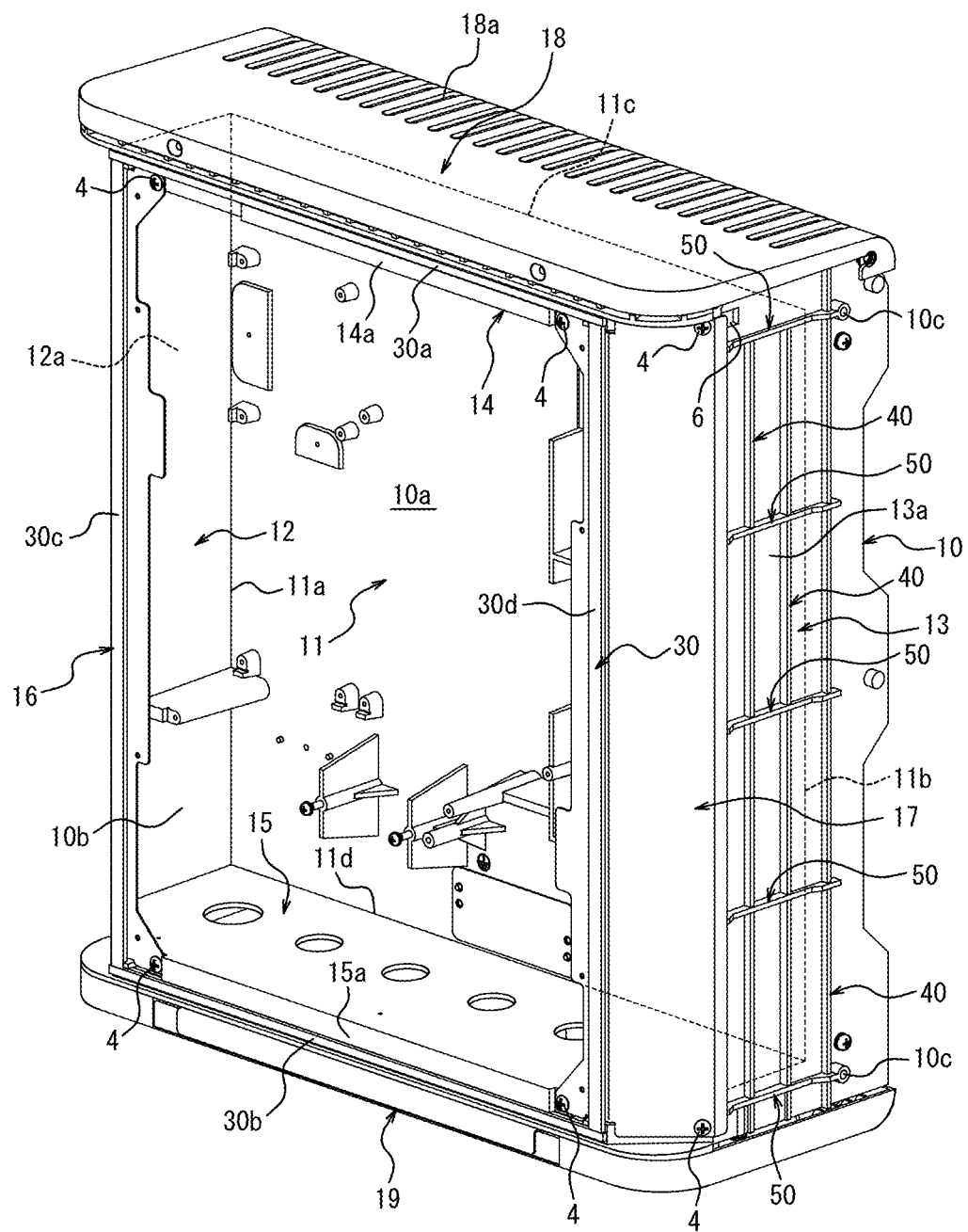
FIG. 2 is a perspective view of a casing body illustrated in FIG. 1.

As illustrated in FIG. 2, the casing body 10 has a box shape including a first wall 11, a second wall 12, a third wall 13, a fourth wall 14, and a fifth wall 15. In the present embodiment, the casing body 10 is a cast product made of aluminum alloy in which the first wall 11, the second wall 12, the third wall 13, the fourth wall 14, and the fifth wall 15 are integrally provided. The casing body 10 having the configuration and shape as described above can be easily manufactured at a high productively.

The casing body 10 is not limited to the cast product made of aluminum alloy described above and may be a cast product such as a cast iron product or other metal cast products. The casing body 10 is not limited to a cast metal product and may be a product made of another material such as, for example, an injection-molded product made of a synthetic resin material. Further, the casing body 10 may have a configuration in which the first wall 11, the second wall 12, the third wall 13, the fourth wall 14, and the fifth wall 15 are formed separately from one another and integrally connected to one another by means such as welding, bonding, fastening, or the like.

The first wall 11 includes a first side 11a and a second side 11b parallel to each other. The first wall 11 also includes a third side 11c and a fourth side 11d that are orthogonal to the first side 11a and the second side 11b and parallel to each other. As described above, the first wall 11 has a rectangular plate-like shape in appearance formed by the four sides 11a to 11d. In the present embodiment, the first wall 11 constitutes a rear surface of the casing body 10.

The second wall 12 has an elongated rectangular plate-like shape and is continuous at a right angle to the first wall 11 on the first side 11a. The third wall 13 has an elongated rectangular plate-like shape in a manner similar to the second wall 12 and is opposing the second all 2 and continuous at a right angle to the first wall 11 on the second side 11b. In the present embodiment, the second wall 12 and the third wall 13 oppose each other in parallel and constitute respective outer side surfaces 12a and 13a facing left and right sides of the casing body 10.

The fourth wall 14 has an elongated plate-like shape and is continuous at a right angle to the third side 11c of the first wall 11 and, simultaneously, to upper sides of the second wall 12 and the third wall 13 located on the upper side in FIG. 2. The fourth wall 14 has a shape having a trapezoidal protruding portion that protrudes in a direction remote from the first wall 11 and includes a surface of the protruding portion that is parallel to the first wall 11 and functions as an end surface 14a of the fourth wall 14 facing opposite from the first wall 11. In the present embodiment, the fourth wall 14 constitutes a top surface of the casing body 10 facing up.

The fifth wall 15 has an elongated plate-like shape having a trapezoidal protruding portion in a manner similar to the fourth wall 14, opposes the fourth wall 14, and is continuous at a right angle to the fourth side 11d of the first wall 11 and also to bottom sides of the second wall 12 and the third wall 13 illustrated on a lower side in FIG. 2. A surface of the protruding portion of the fifth wall 15 parallel to a surface of the first wall 11 functions as an end surface 15a of the fifth wall 15 facing an opposite side of the first wall 11. In the present embodiment, the fifth wall 15 constitutes a bottom surface of the casing body 10 that is facing down.

The casing body 10 is provided with a first partition wall 16 and a second partition wall 17. Each of the first partition wall 16 and the second partition wall 17 is formed by performing sheet metal processing of one metal plate material made of, for example, steel, aluminum alloy, or stainless steel. The first partition wall 16 is attached to the casing body 10 by screw members 4 in a state being continuous to an end surface of the second wall 12 of the casing body 10 facing an opposite side of the first wall 11 and inclined with respect to the second wall 12. Similarly, the second partition wall 17 is attached to the casing body 10 by the screw members 4 in a state being continuous to an end surface of the third wall 13 of the casing body 10 facing an opposite side of the first wall 11 and inclined with respect to the third wall 13.

Although in the present embodiment both the first partition wall 16 and the second partition wall 17 are formed separately from the casing body 10 and the cover body 20, the first partition wall 16 and the second partition wall 17 may be integrally formed with the casing body 10. Alternatively, the first partition wall 16 and the second partition wall 17 may be integrally formed with the cover body 20.

The casing body 10 has a housing space 10a therein. The electrical apparatus 3 is housed in the housing space 10a. The side of the casing body 10 opposing the first wall 11 has an opening 10b. The opening 10b has a rectangular shape defined by an end surface 14a of the fourth wall 14, an end surface 15a of the fifth wall 15, a side portion of the first partition wall 16, and a side portion of the second partition wall 17. By removing the cover body 20 from the casing body 10 and communicating the opening 10b to the outside, the electrical apparatus 3 can be arranged in the housing space 10a through the opening 10b.

Atop cover 18 and a bottom cover 19 are attached to the casing body 10.

The top cover 18 is made of synthetic resin and attached to the casing body 10 to cover the fourth wall 14 from above. The top cover 18 includes a plurality of discharge holes 18a having slit-like shapes for exhausting air heated by heat radiated through a heat sink provided on a top surface of the fourth wall 14 to the outside. By attaching the top cover 18, the fourth wall 14 or the heat sink heated by heat from the electrical apparatus 3 can be suppressed from being directly touched by hands, whereby safety is improved.

The bottom cover 19 is made of synthetic resin and attached to the casing body 10 to cover a bottom side of the fifth wall 15. The bottom cover 19 can receive water discharged along the outer side surface 12a of the second wall 12 and the outer side surface 13a of the third wall 13 and discharge the water to the outside through a discharge hole provided at a predetermined position. Further, by attaching the bottom cover 19, the fifth wall 15 heated by heat from the electrical apparatus 3 can be suppressed from being directly touched by hands, whereby safety is improved.

Figure 3:
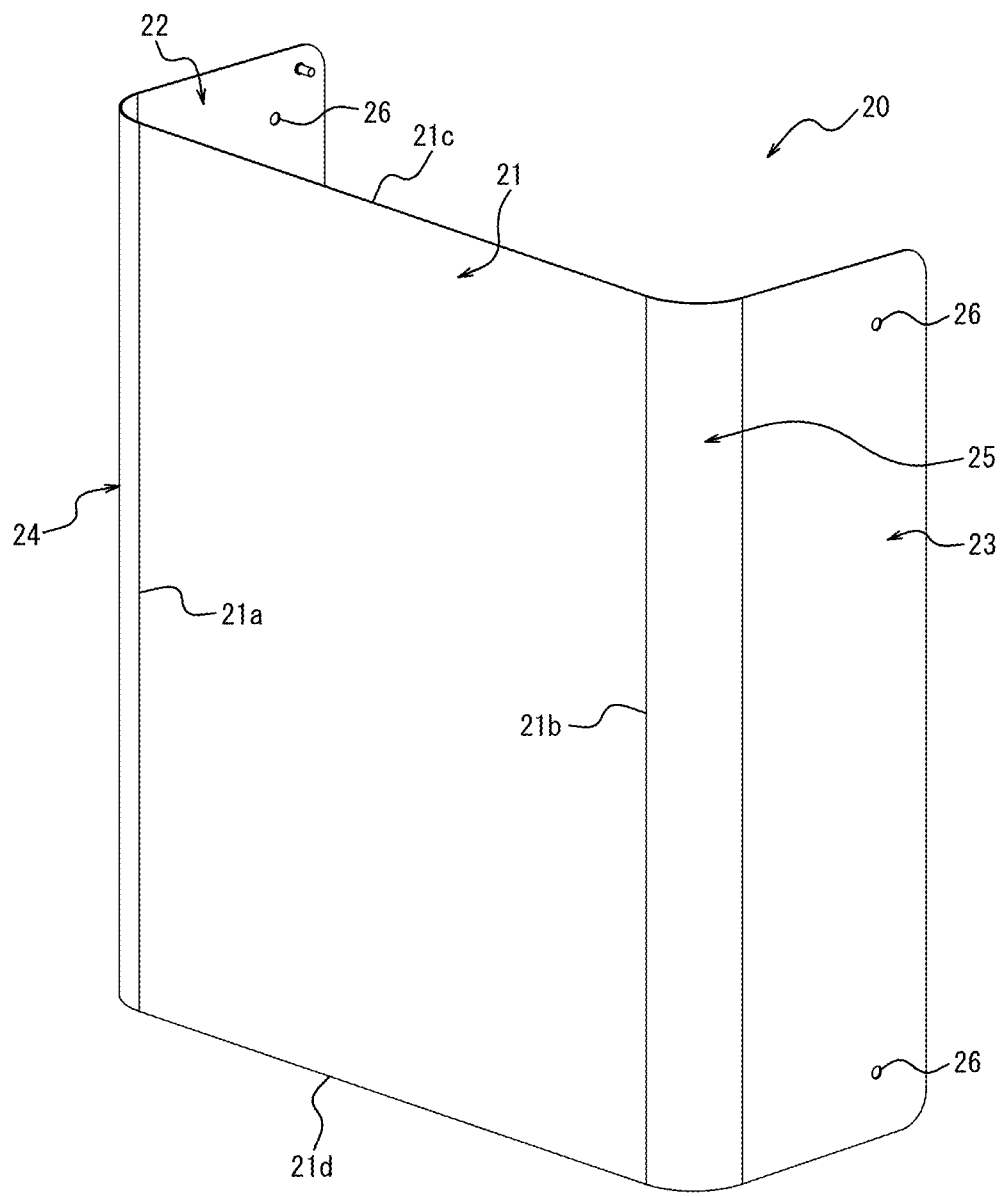
FIG. 3 is a perspective view of a cover body illustrated in FIG. 1.

As illustrated in FIG. 3, the cover body 20 has a U-shape in cross-section and includes a flat plate-like cover portion 21, and a first outer side surface cover portion 22 and a second outer side surface cover portion 23 provided on either side of the flat plate-like cover portion 21.

The flat plate-like cover portion 21 has a first side 21a and a second side 21b that are parallel to the first side 11a of the first wall 11 of the casing body 10. Further, the flat plate-like cover portion 21 has a third side 21c and a fourth side 21d that are parallel to the third side 11c of the first wall 11. Thus, the flat plate-like cover portion 21 has a rectangular plate-like shape having the four sides 21a to 21d.

The first outer side surface cover portion 22 is continuous to the first side 21a serving as one side of the flat plate-like cover portion 21, via the first curved cover portion 24. The first curved cover portion 24 is curved in an arc at a central angle of 90 degrees about a central axis, which is an axis parallel to the first side 21a, from the first side 21a to the side of the first wall 11. The first outer side surface cover portion 22 has a rectangular plate-like shape parallel to the second wall 12.

Similarly, the second outer side surface cover portion 23 is continuous to the second side 21b serving as one side of the flat plate-like cover portion 21, via the second curved cover portion 25. The second curved cover portion 25 is curved in an arc at a central angle of 90 degrees about a central axis, which is an axis parallel to the second side 21b, from the second side 21b to the first wall 11. The second outer side surface cover portion 23 has a rectangular plate-like shape parallel to the third wall 13.

Each of the first outer side surface cover portion 22 and the second outer side surface cover portion 23 is provided with two attaching holes 26 (Note: FIG. 3 illustrates one attaching hole 26 of the first outer side surface cover portion 22). As illustrated in FIG. 2, on the other hand, the second wall 12 and the third wall 13 of the casing body 10 are provided with two screw holes 10c on sides of the first wall 11 and sides of the fourth wall (14) and the fifth wall (15). As illustrated in FIG. 1, the cover body 20 is attached to the casing body 10 by screwing the screw members 5 inserted into the attaching holes 26 of the cover body 20 into corresponding screw holes 10c of the casing body 10.

In a state in which the cover body 20 is attached to the casing body 10, the flat plate-like cover portion 21 covers the opening 10b formed on the front surface of the casing body 10. Also, in the state in which the cover body 20 is attached to the casing body 10, the first outer side surface cover portion 22 opposes the outer side surface 12a of the second wall 12 with a predetermined gap therebetween and covers the outer side surface 12a. Further, in the state in which the cover body 20 is attached to the casing body 10, the second outer side surface cover portion 23 opposes the outer side surface 13a of the third wall 13 with a predetermined gap therebetween and covers the outer side surface 13a.

The cover body 20 may be formed by, for example, performing sheet metal processing of a metal plate made of steel, aluminum alloy, or stainless steel. Thus, the cover body 20 having the above shape can be formed easily at low cost by a simple bending process. A plate thickness of the cover body 20 can be determined appropriately and may preferably be, for example, 0.3 mm to 3.5 mm.

The cover body 20 is not limited to be formed by performing sheet metal processing of a plate material and may have a structure in which the flat plate-like cover portion 21, the first outer side surface cover portion 22, the second side surface cover portion 23, the first curved cover portion 24, and the second curved cover portion 25 are formed separately and integrally connected to one another by means such as welding, adhesion, or fastening. Further, the cover body 20 is not limited to a metal product and may be a product made of another material such as an injection molded product made of a synthetic resin material.

In the present embodiment, in the cover body 20, the first outer side surface cover portion 22 is continuous to the flat plate-like cover portion 21 via the first curved cover portion 24, and the second outer side surface cover portion 23 is continuous to the flat plate-like cover portion 21 via the second curved cover portion 25. However, each of the first outer side surface cover portion 22 and the second outer side surface cover portion 23 may be directly continuous to the flat plate-like cover portion 21.

As illustrated in FIG. 2, a seal member 30 having a waterproof function is attached to the casing body 10 in a manner surrounding the opening 10b. In the state in which the cover body 20 is attached to the casing body 10, the seal member 30 is tucked between the casing body 10 and the flat plate-like cover portion 21 of the cover body 20 and seals between the casing body 10 and the flat plate-like cover portion 21 to the extent that water such as rainwater does not enter.

In the present embodiment, the seal member 30 includes a first sealing piece 30a attached to the end surface 14a of the fourth wall 14, a second sealing piece 30b attached to the end surface 15a of the fifth wall 15, a third sealing piece 30c attached to a side surface of the first partition wall 16, and a fourth sealing piece 30d attached to a side surface of the second partition wall 17, which are connected to one another. Each of the first sealing piece 30a, the second sealing piece 30b, the third sealing piece 30c, and the fourth sealing piece 30d may be formed from, for example, an elastic body such as synthetic rubber or an elastomer, or a rubber sponge which is a foam of ethylene propylene rubber.

A sealing member having a waterproof function may be provided between the first partition wall 16 and the second wall 12 and between the second partition wall 17 and the third wall 13.

To shield a gap between the outer side surface 12a of the second wall 12 and the first outer side surface cover portion 22, the outer side surface 12a is provided with three first ribs 40 (see FIG. 7). Similarly, to shield a gap between the outer side surface 13a of the third wall 13 and the second outer side surface cover portion 23, the outer side surface 13a is provided with three first ribs 40, as illustrated in FIG. 2.

Further, both the outer side surface 12a and the outer side surface 13a are provided with five second ribs 50, in addition to the three first ribs 40 described above.

Other than that the outer surface 12a of the second wall 12 and the outer side surface 13a of the third wall 13 are symmetrical to each other, they are provided with the first rib 40 and the second rib 50 in basically the same manner. Accordingly, the first rib 40 and the second rib 50 provided on the outer side surface 13a of the third wall 13 will be mainly described.

Figure 4:
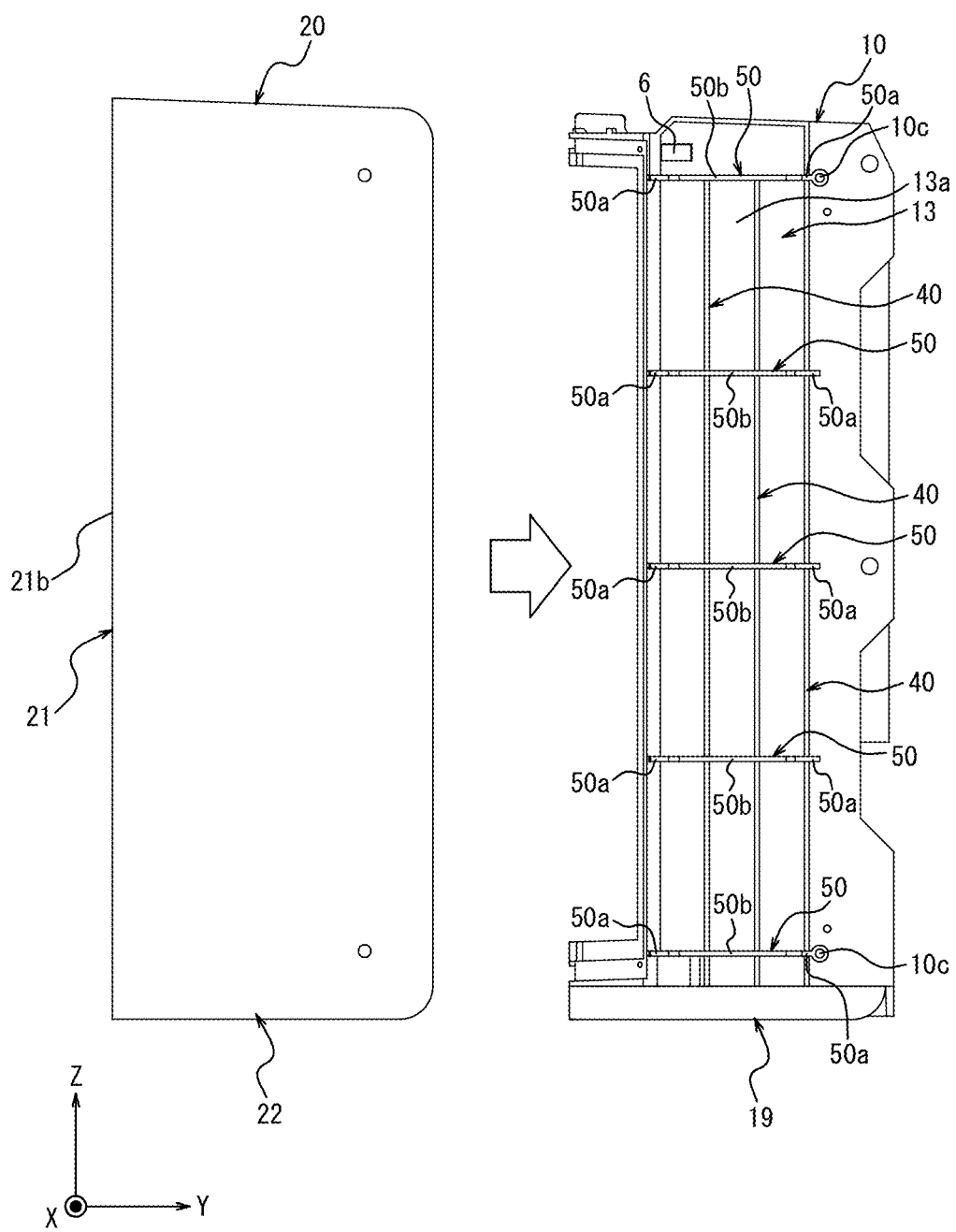
FIG. 4 illustrates side views of the cover body and the casing body.

Each of the three first ribs 40 provided on the outer side surface 13a of the third wall 13 is integrally formed with the outer side surface 13a, as illustrated in FIG. 4. Each of the first ribs 40 has a wall shape that protrudes toward the outside of the casing body 10 from the outer side surface 13a and has a protruding end opposing an inner surface of the second outer side surface cover portion 23 having a predetermined gap therefrom. Also, the first ribs 40 extend along the second side 21b serving as one side of the flat plate-like cover portion 21 between a top side of the outer side surface 13a on the side of the fourth wall 14 and a bottom side on the side of the fifth wall 15. Further, the first ribs 40 are arranged at intervals from each other in a direction orthogonal to the second side 21b and parallel to the outer side surface 13a of the third wall 13. The three first ribs 40 are parallel to each other. Note that "the first ribs 40 extend along the second side 21b serving as one side of the flat plate-like cover portion 21" is not limited to a configuration in which the first ribs 40 extend strictly keeping a constant distance with respect to the second side 21b (in a configuration in which the first ribs 40 are parallel to the second side 21b) and may include a state in which the first ribs 40 are not parallel to the second side 21b.

Figure 6:
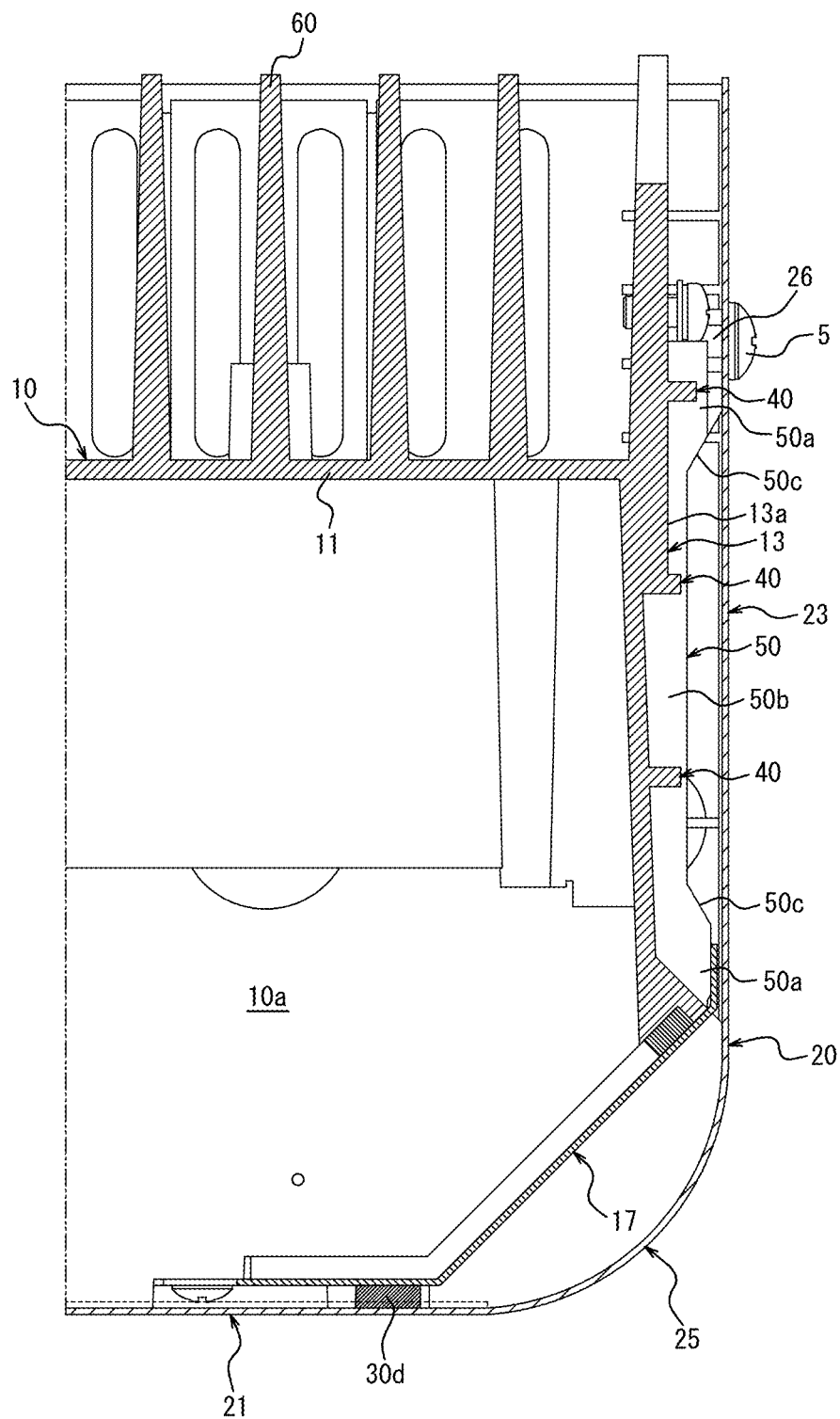
FIG. 6 is a cross-sectional view of a main section of the power control apparatus illustrated in FIG. 1.

Although the outer side surface 13a has a configuration in which the three first ribs 40 are stepped across the first rib 40 located in the middle of the three first ribs 40 as illustrated in FIG. 6, the first rib 40 located in the middle protrudes toward the outside of the casing body 10 with respect to the outer side surface 13a on either side thereof. Further, of the three first ribs 40, each the first rib 40 on the side of the flat plate-like cover portion 21 and the first rib 40 located in the middle has an approximately the same gap between their protruding direction ends and the inner surface of the second outer side surface cover portion 23. On the other hand, a gap between a protruding direction end of the first rib 40 located on the farthest side from the flat plate-like cover portion 21 and the inner surface of the second outer side surface cover portion 23 is smaller than the gap between the protruding direction ends of the other two first ribs 40 and the inner surface of the second outer side surface cover portion 23.

As described above, the power control apparatus 1 of the present embodiment can be installed outdoors in a manner being mounted on, for example, an exterior wall of a house using a mounting bracket or the like. Here, the power control apparatus installed outdoors is required to have a high waterproof property due to its environment exposed to wind and rain and, in consideration of a situation exposed to storms, desired to obtain a protection grade corresponding to "IP45" according to "JIS C0920" defined by the Japanese Industrial Standards. In this case, regarding protection against a jet flow, it is necessary to satisfy a waterproof performance that "must not have a harmful influence caused by jet water from nozzles located in all directions".

However, a conventional configuration in which a waterproof seal is arranged between a casing body for housing an electrical apparatus and a cover body for closing an opening of the casing body has a risk that the waterproof seal is broken and lets water enter the casing body, upon application of a large water pressure to the waterproof seal by jet water entering at a high flow rate between the casing body and the cover body.

In a configuration in which a gap is formed between the first outer side surface cover portion 22 and the outer side surface 12a of the second wall 12 in a manner similar to the power control apparatus 1, because there is a risk that jet water enters the gap between the first outer side surface cover portion 22 and the outer side surface 12a of the second wall 12 from a rear surface. i.e., the casing body 10 on the side of the first wall 11, a high waterproof performance is required against such jet water. Similarly, in the power control apparatus 1 of the present embodiment, because a gap is formed also between the second outer side surface cover portion 23 and the outer side surface 13a of the third wall 13, jet water may enter a gap between the second outer side surface cover portion 23 and the outer side surface 13a of the third wall 13 from the rear surface, i.e., the casing body 10 on the side of the first wall 11, and thus a high waterproof performance is required against such jet water.

In the power control apparatus 1 of the present embodiment, on the other hand, because the first ribs 40 are provided on the outer side surface 12a of the second wall 12 covered by the first outer side surface cover portion 22, even if jet water enters a gap between the first outer side surface cover portion 22 and the outer side surface 12a of the second wall 12, the jet water can hit the first ribs 40 and reduce its force. Thus, an amount of jet water reaching the third sealing piece 30c can be reduced, and a water pressure of the jet water reaching the third sealing piece 30c is reduced, whereby the third sealing piece 30c arranged between the flat plate-like cover portion 21 and the casing body 10 can reliably suppress water intrusion. Similarly, in the power control apparatus 1, because the first ribs 40 are provided also on the outer side surface 13a of the third wall 13 covered by the second outer side surface cover portion 23, even if jet water enters the gap between the second outer side surface cover portion 23 and the outer side surface 13a of the third wall 13, the jet water can hit the first rib 40 and reduce its force. Thus, an amount of jet water reaching the fourth sealing piece 30d is reduced, and a water pressure of the jet water reaching the fourth sealing piece 30d is reduced, whereby the fourth sealing piece 30d arranged between the flat plate-like cover portion 21 and the casing body 10 can reliably suppress the water intrusion.

The first ribs 40 simply need to extend along the first side 21a and the second side 21b, which are the respective sides of the flat plate-like cover portion 21, and preferably extend in parallel with them, as described in the present embodiment. In this configuration, the first ribs 40 extend in a direction orthogonal to jet water entering toward the opening 10b from a rear side of the casing body 10 and can effectively block a flow of jet water entering the gap between the first outer side surface cover portion 22 and the outer side surface 12a of the second wall 12 and the gap between the second outer side surface cover portion 23 and the outer side surface 13a of the third wall 13. Thus, the third sealing piece 30c and the fourth sealing piece 30d can improve the waterproof properties between the flat plate-like cover portion 21 and the casing body 10.

Further, in a manner similar to the power control apparatus 1 according to the present embodiment, the plurality of first ribs 40 arranged side by side at intervals on the outer side surfaces 12a and 13a can reduce, in a stepwise manner, the force of jet water entering the gap between the first outer side surface cover portion 22 and the outer side surface 12a of the second wall 12 and the gap between the second outer side surface cover portion 23 and the outer side surface 13a of the third wall 13. As a result, the amounts of jet water reaching the third sealing piece 30c and the fourth sealing piece 30d can be further reduced, and the water pressures of the jet water reaching the third sealing piece 30c and the fourth sealing piece 30d can be further reduced, whereby the third sealing piece 30c and the fourth sealing piece 30d can reliably suppress the water intrusion between the flat plate-like cover portion 21 and the casing body 10.

As illustrated in FIG. 4, the five second ribs 50 provided on the outer side surface 13a of the third wall 13 are integrally formed on the outer side surface 13a and project from the outer side surface 13a toward the outside of the casing body 10. A protrusion height of the second ribs 50 from the outer side surface 13a is equal to or greater than a protrusion height of the first ribs 40 from the outer surface 13a. In the present embodiment, a protrusion height of the second ribs 50 from the outer side surface 13a is greater than the protrusion height of the first ribs 40 from the outer side surface 13a.

Each of the second ribs 50 is seen through from the front side on the side of the opening 10b of the outer side surface 13a to the rear side on the side of the first wall 11 toward the outer side surface 13a and extends in a direction orthogonal to the second side 21b serving as a side of the flat plate-like cover portion 21 and parallel to the outer side surface 13a of the third wall 13. That is, each of the second ribs 50 extends in a direction orthogonal to each of the first ribs 40. Further, the second ribs 50 are arranged spaced apart from one another in a direction orthogonal to the second side 21b and parallel to the outer surface 13a of the third wall 13, i.e., an extension direction of the first ribs 40.

Figure 5:
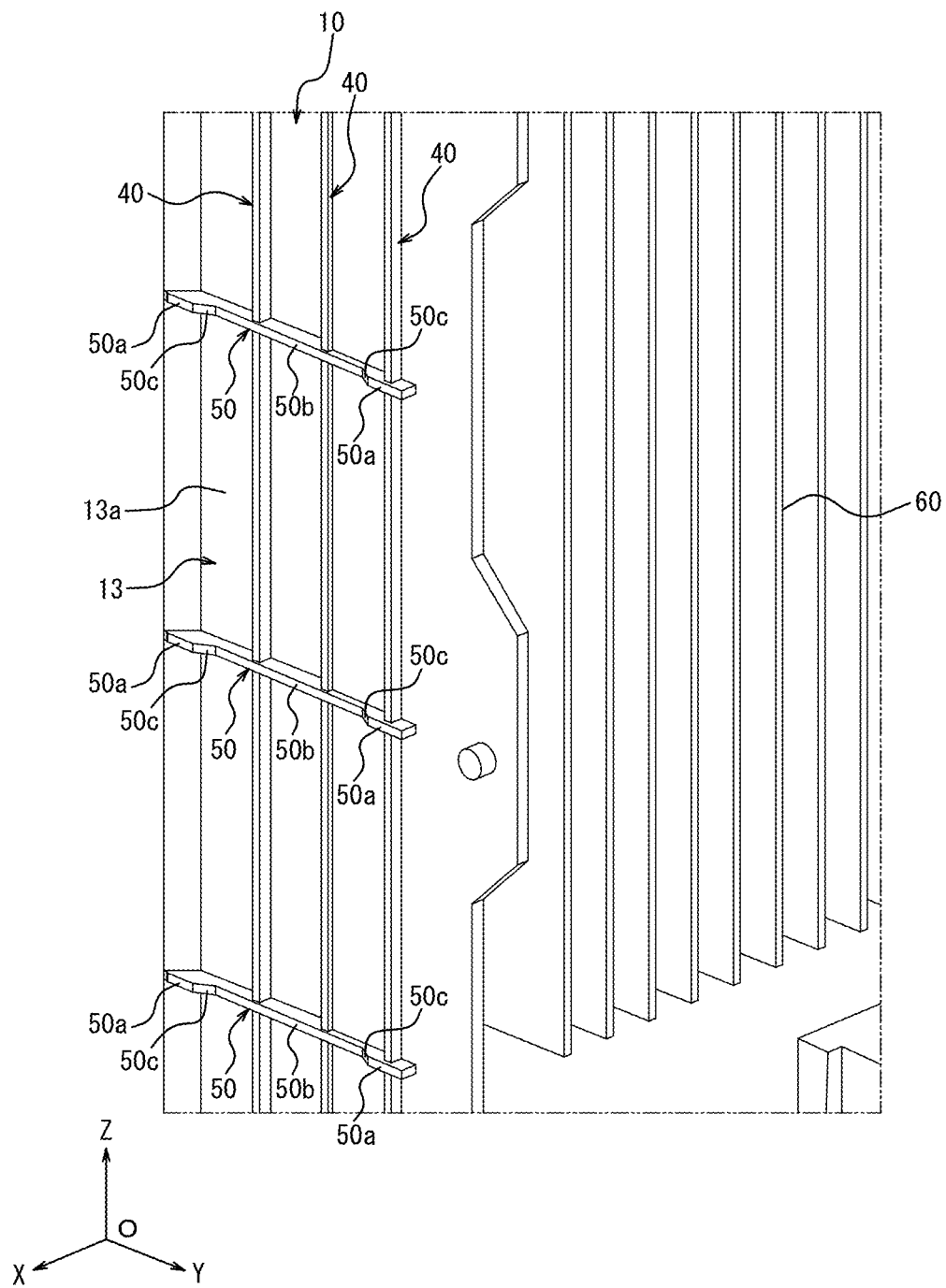
FIG. 5 is an enlarged perspective view illustrating a detail of second ribs.

As illustrated in FIG. 5, each of the second ribs 50 includes a pair of first protruding portions 50a protruding from the outer side surface 13a by a predetermined height and a second protruding portion 50b protruding from the outer surface 13a by a smaller protrusion height than the first protruding portions 50a. The first protruding portions 50a are provided on the front side of the second ribs 50 on the side of the opening 10b and the rear side of the second ribs 50 on the side of the first wall 11, and the second protrusion 50b is provided between the first protrusions 50a. An inclined portion 50c having a gradually changing protrusion height from the outer side surface 13a is provided between the first protruding portion 50a and the second protruding portion 50b.

As illustrated in FIG. 4, the first protruding portion 50a of the second rib 50 located on the side of the fourth wall 14, from among the five second ribs 50, and the first protruding portion 50a of the five second rib 50 located on the side of the fifth wall 15, from among the five second ribs 50, have respective screw holes 10c described above at end surfaces in protruding directions. Protrusion heights of these first protruding portions 50a from the outer side surface 13a are higher than protrusion heights of other first protruding portions 50a from the outer side surface 13a.

Of the three first ribs 40, two first ribs 40 counted from the side of the opening 10b are orthogonal to the protruding portions 50b of the second rib 50. Protrusion heights of the two first ribs 40 from the outer side surface 13a are lower than the protrusion height of the second protruding portion 50b from the outer side surface 13a. On the other hand, of the three first rib 40, the first rib 40 arranged farthest from the opening 10b is orthogonal to the first protruding portion 50a of the second rib 50. The protrusion height of the first rib 40 from the outer side surface 13a is lower than the protrusion height of the first protruding portion 50a from the outer side surface 13a.

In FIG. 5, members denoted by a reference sign 60 are a plurality of heat sinks integrally provided on a rear surface of the first wall 11 facing the outside of the first wall 11. Each of the second wall 12 and the third wall 13 has an overhanging portion protruding from the first wall 11 toward an opposite side of the opening 10b, and the heat sink 60 is arranged parallel to the protruding portions of the second wall 12 and the third wall 13.

As illustrated in FIG. 6, in the state in which the cover body 20 is attached to the casing body 10, the inner side of the second outer side surface cover portion 23 is in contact with the end surface of one of the first protruding portion 50a in the protruding direction on the side of the opening 10b of each of the second ribs 50 via a portion of the second partition wall 17. In the state in which the cover body 20 is attached to the casing body 10, further, the inner side of the second outer side surface cover portion 23 abuts on the end surface of the first protruding portion 50a of the second rib 50 in the protruding direction provided with the screw hole 10c arranged in the vicinity of the fourth wall 14 and the end surface of the first protruding portion 50a of the second rib 50 in the protruding direction provided with the screw hole 10c arranged in the vicinity of the fifth wall 15. In the state in which the cover body 20 is attached to the casing body 10, because the first protruding portions 50a of the second rib 50 protruding from the outer side surface 13a support the inner surface of the outer side surface cover portion 23 as described above, a gap is formed between the second outer side surface cover portion 23 and the outer side surface 13a.

By providing the second ribs 50 in addition to the first ribs 40 on both the second wall 12 and the third wall 13, the second wall 12 and the third wall 13 can be thinner and lighter while having increased rigidity. Further, heat generated during operation of the electrical apparatus 3 housed in the housing space 10a can be effectively dissipated by the second wall 12 and the third wall 13.

The second outer side surface cover portion 23 covering the outer side surface 13a of the third wall 13 is supported by the first protruding portions 50a of the plurality of second ribs 50 provided on the outer side surface 13a, in a manner such that the gap is formed between the second outer side surface cover portion 23 and the outer side surface 13a. Thus, an amount of heat conducted from the third wall 13 heated by heat generated during the operation of the electrical apparatus 3 housed in the housing space 10a to the second outer side surface cover portion 23 can be reduced. As a result, excessive rising of the temperature of the cover body 20 can be suppressed, and the safety can be improved for when a user such as a resident touches the cover body 20.

Further, because the second outer side surface cover portion 23 abuts on the first protruding portion 50a of the plurality of second ribs 50 and is arranged in the vicinity of the plurality of first ribs 40, the second outer side surface cover portion 23 can be supported by the plurality of second ribs 50 and the plurality of first ribs 40 when the second outer side surface cover portion 23 is pressed by the user such as the resident. Thus, excessive deformation of the second outer side surface cover portion 23 can be suppressed, and a structural strength of the cover body 20 can be improved.

As illustrated in FIG. 7, in the power control apparatus 1 of the present embodiment, the cover body 20 is formed in the U-shape in the cross section having the first outer side surface cover portion 22 and the second outer side surface cover portion 23 arranged on either side of the flat plate-like cover portion 21 and is attached to the casing body 10 by being shifted along a direction vertical to the first wall 11 from the side of the opening 10b to the side of the first wall 11. At this time, the first outer side surface cover portion 22 of the cover body 20 is shifted along the outer side surface 12a of the second wall 12 of the casing body 10, and the second outer side surface cover portion 23 of the cover body 20 is shifted along the outer side surface 13a of the third wall 13 of the casing body 10. Thus, in the configuration in which the first ribs 40 are provided on the outer side surfaces 12a and 13a, the cover body 20 needs to be easily attached to the casing body 10 without causing the front ends of the first outer side surface cover portion 22 and the second outer side surface cover portion 23 in the assembling direction to get caught by the first ribs 40.

In the power control apparatus 1 of the present embodiment, on the other hand, the second ribs 50 having the protrusion height from the outer side surfaces 12a and 13a higher than the protrusion height of the first ribs 40 from the outer side surfaces 12a and 13a are provided to the outer side surfaces 12a and 13a. Thus, at the time of the attachment of the cover body 20 to the casing body 10, the first outer side surface cover portion 22 and the second outer side surface cover portion 23 are guided by the second ribs 50 without touching the first ribs 40. As a result, when the cover body 20 is attached to the casing body 10, the first outer side surface cover portion 22 and the second outer side surface cover portion 23 cam be suppressed from getting caught by the first ribs 40, and the cover body 20 can be more easily attached to the casing body 10.

The protrusion height of the second ribs 50 from the outer side surfaces 12a and 13a simply needs to be equal to or higher than the protrusion height of the first ribs 40 from the outer side surfaces 12a and 13a. However, by setting the protrusion height of the second ribs 50 from the outer side surfaces 12a and 13a higher than the protrusion height of the first ribs 40 from the outer side surfaces 12a and 13a, the first outer surface cover potion 22 and the second outer side surface cover portion 23 can be more reliably suppressed from getting caught by the first ribs 40.

In the power control apparatus 1 of the present embodiment, as described above, the outer side surface 12a of the second wall 12 is covered by the first outer side surface cover portion 22. Thus, air heated by heat exhausted from the casing body 10 between the outer side surface 12a of the second wall 12 and the first outer side surface cover portion 22 moves upward between the outer side surface 12a of the second wall 12 and the first outer side surface cover portion 22 (i.e., from the side of the fifth wall 15 to the side of the fourth wall 14). However, a configuration in which the second ribs 50 abut on the first outer side surface cover portion 22 throughout their lengths has a problem that the upward movement of the air is inhibited by the second ribs 50 and the heated air stays between the outer side surface 12a of the second wall 12 and the first outer side surface cover portion 22, whereby a heat radiation performance of the casing body 10 is reduced. Similarly, a configuration in which the second ribs 50 abut on the second outer side surface cover portion 23 throughout their lengths has a problem that the upward movement of the air between the outer side surface 13a of the third wall 13 and the second outer side surface cover portion 23 is inhibited by the second ribs 50 and the heated air stays between the outer side surface 13a of the third wall 13 and the second outer side surface cover portion 23, whereby the heat radiation performance of the casing body 10 is reduced.

In the power control apparatus 1 of the present embodiment, on the other hand, each of the second ribs 50 includes the first protruding portion 50a protruding from the outer side surfaces 12a and 13a by the predetermined height and the second protruding portion 50b having the protrusion height from the outer side surfaces 12a and 13a lower than the protrusion height of the first protruding portion 50a, such that the second protruding portion 50b forms an air passage that allows the air to move upward. Thus, air heated between the outer side surface 12a and the first outer side surface cover portion 22 and air heated between the outer side surface 13a and the second outer side surface cover portion 23 can pass the second ribs 50 via the second protruding portions 50b. As a result, the heated air can be exhausted to the outside without staying between the outer side surface 12a of the second wall 12 and the first outer side surface cover portion 22 and between the outer side surface 13a of the third wall 13 and the second outer side surface cover portion 23, and heat radiation performance of the casing body 10 can be improved.

Each of the second wall 12 and the third wall 13 is provided with a through hole 6 having a rectangular shape, as illustrated in FIG. 4. Water such as rainwater that has entered the inner side of the top cover 18 through the discharge holes 18a thereof and accumulated on the top surface of the fourth wall 14 is discharged through the through hole 6 to the outer side surface 12a of the second wall 12 or the outer side surface 13a of the third wall 13. The water discharged to the outer side surface 12a of the second wall 12 or the outer side surface 13a of the third wall 13 through the through hole 6 flows downward along the outer side surfaces 12a and 13a into the bottom cover 19 and is then drained to the outside through a drain hole formed on the bottom cover 19.

Here, as described above, because the power control apparatus 1 of the present embodiment has the configuration in which the second ribs 50 have the first protruding portions 50a protruding by the predetermined height from the outer side surfaces 12a and 13a and the second protruding portions 50b protruding from the outer side surfaces 12a and 13a by the protrusion height lower than that of the first protruding portions 50a, the second protruding portions 50b also function as the water passage. Thus, water discharged through the through hole 6 can be drained to the outside without staying between the outer side surface 12a of the second wall 12 and the first outer side surface cover portion 22 and between the outer side surface 13a of the third wall 13 and the second outer side surface cover portion 23. As a result, deterioration of coating films and progress of corrosion of the metal in the casing body 10 and the cover body 20 caused by water retention can be suppressed.

In the present embodiment, central portions of the second ribs 50 have the protrusion height lower than that of the end portions of the second rib 50 in a direction orthogonal to the first side 21a and the second side 21b serving as the respective sides of the flat plate-like cover portion 21 and parallel to the outer side surfaces 12a and 13a, such that the second protruding portions 50b are provided between respective pairs of first protruding portions 50a. However, this is not restrictive. The second ribs 50 may have a configuration including the first protruding portion 50a and the second protruding portion 50b, in which a protrusion height of the end portions in the above direction is lower than a protrusion height of another portion.

The present disclosure is not limited to the above embodiments, and various modifications can be made without departing from the scope of the disclosure.

For example, although in the above embodiment the three first ribs 40 are provided on the outer side surfaces 12a and 13a, at least one first rib 40 is simply needed, and the number of the first ribs 40 can be appropriately determined.

Although in the above embodiments the first ribs 40 are configured to extend parallel to the first side 21a and the second side 21b serving as the respective sides of the flat plate-like cover portion 21, this is not restrictive. The first ribs 40 may be configured to extend in a direction that is not parallel to the first side 21a and the second side 21b serving as the respective sides of the flat plate-like cover portion 21.

Although in the above embodiments the second ribs 50 are provided on both the outer side surface 12a and the outer side surface 13a, the second ribs 50 may be omitted. In a configuration in which the second ribs 50 are provided on the outer side surface 12a and the outer side surface 13a, at least one second rib 50 simply needs to be provided on both the outer side surface 12a and the outer side surface 13a, and the number of the second ribs 50 can be appropriately determined.

The second ribs 50 are not limited to the configuration extending orthogonally to the first ribs 40 and may extend in a direction crossing the first ribs 40 at an angle other than 90 degrees. The protrusion height of the second ribs 50 from the outer side surface 13a may be equal to the protrusion height of the first rib 40 from the outer side surface 13a.

Although the cover body 20 includes the first outer side surface cover portion 22 and the second outer side surface cover portion 23, the cover body 20 may have one of the outer side surface cover portions. In this case, the first rib 40 may be provided on the one of the outer surfaces corresponding to the outer side surface cover portion.

Further, although in the above embodiments the power control apparatus 1 is installed such that the fourth wall 14 is located above the fifth wall 15 and the first wall 11 is parallel to the vertical direction, this is not restrictive. An installing orientation of the power control apparatus 1 can be changed in a various manners.

REFERENCE SIGNS LIST 1 power control apparatus
2 casing for electrical apparatus 3 electrical apparatus
4 screw member
5 screw member
6 through hole
10 casing body
10a housing space
10b opening
10c screw hole
11 first wall
11a first side
11b second side
11c third side
11d fourth side
12 second wall
12a outer side surface
13 third wall
13a outer side surface
14 fourth wall
14a end surface
15 fifth wall
15a end surface
16 first partition wall
17 second partition wall
18 top cover
18a discharge hole
20 cover body
21 flat plate-like cover portion
21a first side
21b second side
21c third side
21d fourth side
22 first outer side surface cover portion
23 second outer side surface cover portion
24 first curved cover portion
25 second curved cover portion
26 attaching hole
30 sealing member
30a first sealing piece
30b second sealing piece
30c third sealing piece
30d fourth sealing piece
40 first rib
50 second rib
50a first protruding portion
50b second protruding portion
50c inclined portion
60 heat sink

The invention claimed is:

1. A casing for an electrical apparatus that houses an electrical apparatus, the casing comprising:
a casing body having an opening;
a cover body that includes:
a flat plate-like cover portion having a rectangular shape for covering the opening, and
an outer side surface cover portion that is continuous to one side of the flat plate-like cover portion and covers an outer side surface of the casing body; and
a first rib that is provided on the outer surface of the casing body covered by the outer side surface cover portion and extends along the one side,
wherein the outer side surface is provided with a second rib that extends in a direction crossing the first rib, the second rib having a protrusion height from the outer side surface equal to or higher than a protrusion height of the first rib from the outer side surface.

2. The casing for an electrical apparatus according to claim 1,
wherein the first rib extends parallel to the one side.

3. The casing for an electrical apparatus according to claim 1,
wherein the outer side surface is provided with a plurality of first ribs arranged spaced apart from each other.

4. The casing for an electrical apparatus according to claim 1,
wherein the second rib extends in a direction orthogonal to the one side and parallel to the outer side surface.

5. The casing for an electrical apparatus according to claim 1,
wherein the second rib includes
a first protruding portion protruding from the outer side surface by a first predetermined height and
a second protruding portion protruding from the outer side surface by a second predetermined height lower than the first predetermined height of the first protruding portion.

6. The casing for an electrical apparatus according to claim 5,
wherein the first protruding portion of the second rib abuts on an outer side surface cover portion.

7. The casing for an electrical apparatus according to claim 1,
wherein the casing body has a box shape including:
a first wall having a rectangular shape;
a second wall continuous to a first side of the first wall;
a third wall that opposes the second wall and is continuous to a second side of the first wall;
a fourth wall continuous to a third side of the first wall, the second wall, and the third wall; and
a fifth wall that opposes the fourth wall and is continuous to a fourth side of the first wall, the second wall, and the third wall, and
a cover body has a U-shape in cross-section having a first outer side surface cover portion for covering an outer surface of the second wall and a second outer side surface cover portion for converting an outer surface of the third wall on either side of a flat plate-like cover portion.

8. A power control apparatus including the casing for an electrical apparatus according to claim 1 and an electrical apparatus housed in the casing for an electrical apparatus.

* * * * *